(12) United States Patent
Hwu

(10) Patent No.: US 11,522,567 B1
(45) Date of Patent: Dec. 6, 2022

(54) MATCHING NETWORK, ANTENNA CIRCUIT AND ELECTRONIC DEVICE

(71) Applicant: Hangzhou Geo-chip Technology Co., Ltd., Hangzhou (CN)

(72) Inventor: Sy-Chyuan Hwu, Hangzhou (CN)

(73) Assignee: Hangzhou Geo-Chip Technology Co., Ltd., Hangzhou (CN)

( * ) Notice: Subject to any disclaimer, the term of this patent is extended or adjusted under 35 U.S.C. 154(b) by 0 days.

(21) Appl. No.: 17/350,443

(22) Filed: Jun. 17, 2021

(51) Int. Cl.
*H04B 1/04* (2006.01)
*H03F 3/24* (2006.01)
*H03H 7/38* (2006.01)

(52) U.S. Cl.
CPC ........... *H04B 1/0458* (2013.01); *H03F 3/245* (2013.01); *H03H 7/38* (2013.01); *H03F 2200/451* (2013.01); *H04B 2001/0408* (2013.01)

(58) Field of Classification Search
CPC .......... H04B 1/0458; H04B 2001/0408; H03F 3/245; H03F 2200/451; H03H 7/38
See application file for complete search history.

(56) References Cited

U.S. PATENT DOCUMENTS

| | | | |
|---|---|---|---|
| 10,141,971 B1* | 11/2018 | Elkholy | H04B 1/18 |
| 2014/0097698 A1* | 4/2014 | Wang | H04B 1/0458 |
| | | | 307/104 |
| 2019/0089396 A1* | 3/2019 | Kim | H04B 1/04 |
| 2021/0105047 A1* | 4/2021 | Mishra | H04B 1/006 |

* cited by examiner

*Primary Examiner* — Nguyen T Vo
(74) *Attorney, Agent, or Firm* — McDonnell Boehnen Hulbert & Berghoff LLP

(57) ABSTRACT

Provided are a matching network, an antenna circuit and an electronic device. The matching network includes a first inductor, a second inductor, and a third inductor, the first inductor having two ends serving as a pair of output terminals, the second inductor having two ends serving as a first pair of input terminals, and the third inductor having two ends serving as a second pair of input terminals, where a first coupling coefficient between the first inductor and the second inductor is greater than a second coupling coefficient between the first inductor and the third inductor. According to the matching network, the matching network can present a rather large resistance value conversion ratio even with a rather small area taken by inductors, the circuit design can be more flexible, and the signal interference can be lowered.

9 Claims, 3 Drawing Sheets

MATCHING NETWORK, ANTENNA CIRCUIT AND ELECTRONIC DEVICE

TECHNICAL FIELD

The present disclosure relates to antennas, and in particular relates to a matching network, an antenna circuit and an electronic device.

BACKGROUND

With reference to FIG. 1, Wi-Fi signal source S1 in an electronic device sends a Wi-Fi signal to antenna A via power amplifier circuit PA1, and Bluetooth signal source S2 sends a Bluetooth signal to the antenna A via power amplifier circuit PA2. The power of the Wi-Fi signal is generally much greater than that of the Bluetooth signal, so if the Wi-Fi signal and the Bluetooth signal are transmitted in the electronic device via the same antenna A, the equivalent load impedance of the power amplifier circuit PA1 has a much smaller resistive component (i.e. the resistance value) than that of the power amplifier circuit PA2. Thus, it is necessary to provide a matching network to enable the antenna A to present different impedances to the power amplifiers PA1 and PA2.

In the solution shown in FIG. 1, the power amplifier circuit PA1 is connected across the inductor L2, so that the Wi-Fi signal is supplied to the antenna A via the coupling between inductors L1 and L2. In order to make the resistive component of the equivalent load seen by the power amplifier circuit PA2 large enough, it is necessary to provide inductors L3, L4 and L5, capacitors C1 and C2. Generally, inductance values of inductors L3, L4 and L5 each differ from that of the inductor L2 by one or two orders of magnitude, and coils of these inductors occupy a rather large area.

SUMMARY

An object of the present disclosure is to provide a matching network, an antenna circuit and an electronic device in view of shortcomings of the prior art.

In order to solve the aforesaid technical problems, the present disclosure provides a technical solution that is a matching network including a first inductor, a second inductor, and a third inductor, the first inductor having two ends serving as a pair of output terminals, the second inductor having two ends serving as a first pair of input terminals, and the third inductor having two ends of serving as a second pair of input terminals, where a first coupling coefficient between the first inductor and the second inductor is greater than a second coupling coefficient between the first inductor and the third inductor.

In some embodiments, the first inductor, the second inductor and the third inductor are arranged on a same substrate, so that, the first inductor has a winding portion with a first orthographic projection onto a plane where the substrate is disposed, the second inductor has a winding portion with a second orthographic projection onto the plane, and the third inductor has a winding portion with a third orthographic projection onto the plane, with a first overlapping area between the first orthographic projection and the second orthographic projection being greater than a second overlapping area between the first orthographic projection and the third orthographic projection.

In some embodiments, the third orthographic projection surrounds the first orthographic projection and the second orthographic projection without overlapping with either the first orthographic projection or the second orthographic projection.

In some embodiments, the third inductor has a greater inductance value than the second inductor.

In some embodiments, the matching network further includes a first capacitor connected across the first inductor.

In some embodiments, the matching network further includes a second capacitor connected across the third inductor.

In some embodiments, the first coupling coefficient between the first inductor and the second inductor is greater than 0.7, and the second coupling coefficient between the first inductor and the third inductor is less than 0.5.

In order to solve the aforesaid technical problems, the present disclosure provides a technical solution that is an antenna circuit including an antenna and the aforesaid matching network, the first inductor having one end grounded and the other end connected to the antenna, where at a same frequency within an operating frequency band of the antenna, the first pair of input terminals has a first equivalent load impedance with a first resistance value and the second pair of input terminals has a second equivalent load impedance with a second resistance value, the first resistance value being smaller than the second resistance value.

In order to solve the aforesaid technical problems, the present disclosure provides a technical solution that is an electronic device including a first power amplifier circuit, a second power amplifier circuit, a first signal source, a second signal source and the aforesaid antenna circuit, where the first power amplifier circuit is configured to amplify a power of signal from the first signal source to be provided to the first pair of input terminals, and the second power amplifier circuit is configured to amplify a power of signal from the second signal source to be provided to the second pair of input terminals.

In some embodiments, the first signal source is a Wi-Fi signal source, and the second signal source is a Bluetooth signal source.

Compared with the prior art, the present disclosure has following technical effects: in an application scenario, the first inductor is configured to be connected to a load, for which the equivalent load seen from the first pair of input terminals is affected by the first coupling coefficient between the second inductor and the first inductor as well as their respective inductance values and the equivalent load seen from the second pair of input terminals is affected by the second coupling coefficient between the third inductor and the first inductor as well as their respective inductance values, and the aforesaid two coupling coefficients can be designed independently, which lowers the requirements on the respective inductance values of the second inductor and the third inductor and enables the overall area occupied by all the inductor coils to be reduced, while this solution can meet differentiated requirements of different power amplifier circuits on respective equivalent loads, thus the matching network can present a rather large resistance value conversion ratio even with a rather small area taken by inductors.

Furthermore, due to the addition of the respective design parameters of the aforesaid two coupling coefficients, the matching network can be designed in a more flexible manner.

Furthermore, since the second inductor and the third inductor are not connected to each other, the mutual interference between signal sources connected to them respectively can be reduced, and the circuit structure can be simpler, which makes it easy to perform design and simulate-verification.

DETAILED DESCRIPTION

In the present disclosure, it should be understood that terms such as "include" or "have", etc., are intended to indicate the existence of the features, numbers, steps, actions, components, parts, or combinations thereof disclosed herein, and are not intended to exclude the possibility that one or more other features, numbers, steps, actions, components, parts, or combinations thereof may exist or may be added.

Furthermore, it should be noted that the embodiments of the present disclosure and features of the embodiments may be combined with each other in any manner as long as they are not contradictory.

The present disclosure will be further described in detail below in conjunction with embodiments shown by the accompanying drawings.

Figure 1:
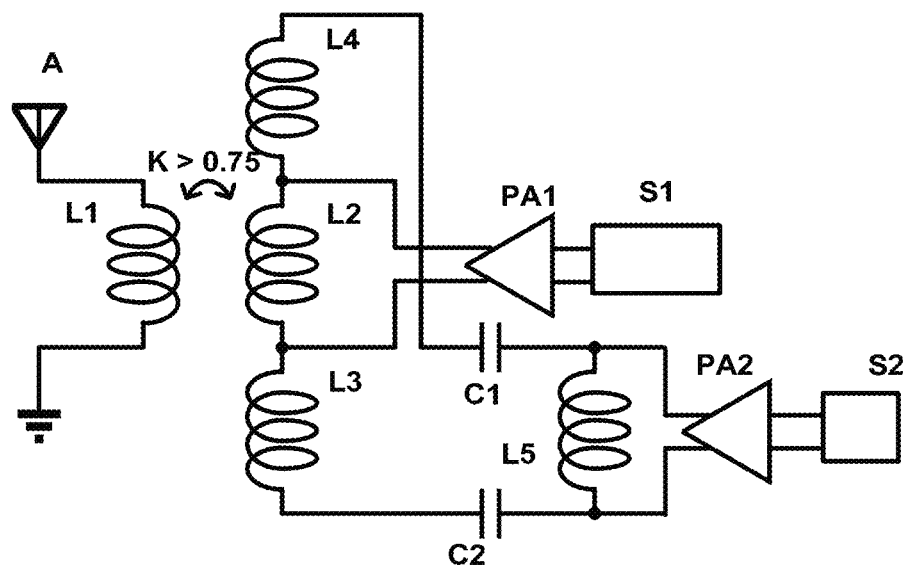
FIG. 1 is an equivalent circuit diagram of an existing electronic device.
Figure 2:
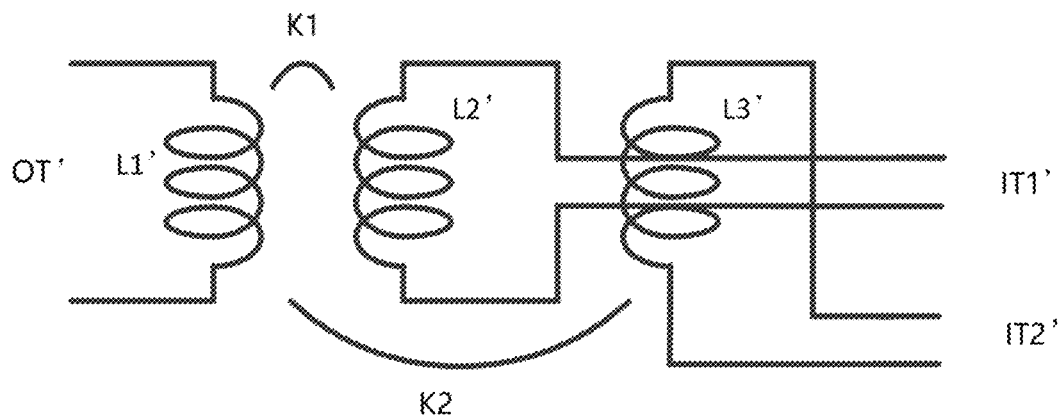
FIG. 2 is an equivalent circuit diagram of a matching network according to embodiments of the present disclosure.

Referring to FIG. 2, embodiments of the present disclosure provide a matching network including a first inductor L1', a second inductor L2' and a third inductor L3', the first inductor L1' having two ends serving as a pair of output terminals OT', the second inductor L2' having two ends serving as a first pair of input terminals IT1', and the third inductor L3' having two ends serving as a second pair of input terminals IT2', where a first coupling coefficient between the first inductor L1' and the second inductor L2' is greater than a second coupling coefficient between the first inductor L1' and the third inductor L3'.

Figure 3:
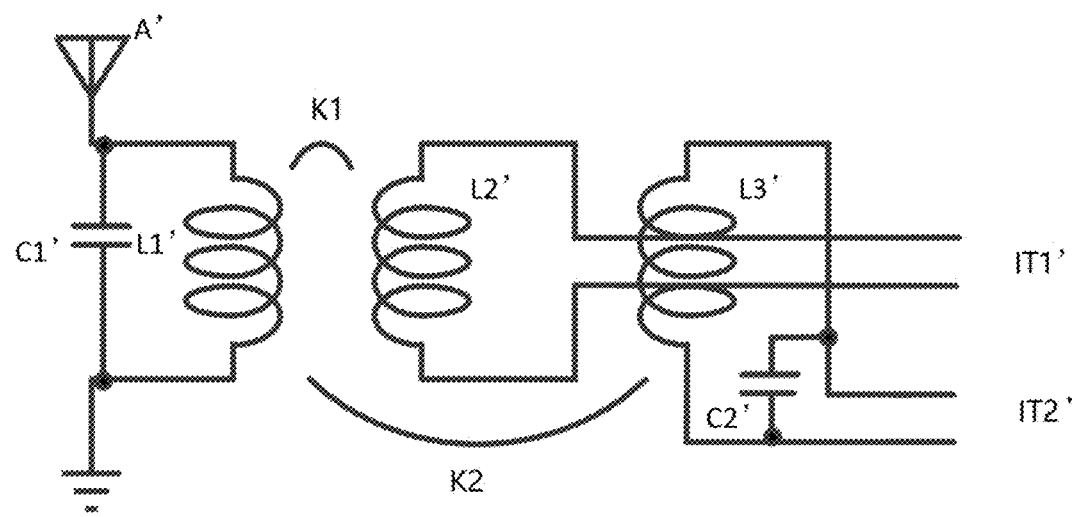
FIG. 3 is an equivalent circuit diagram of an antenna circuit according to embodiments of the present disclosure.
Figure 4:
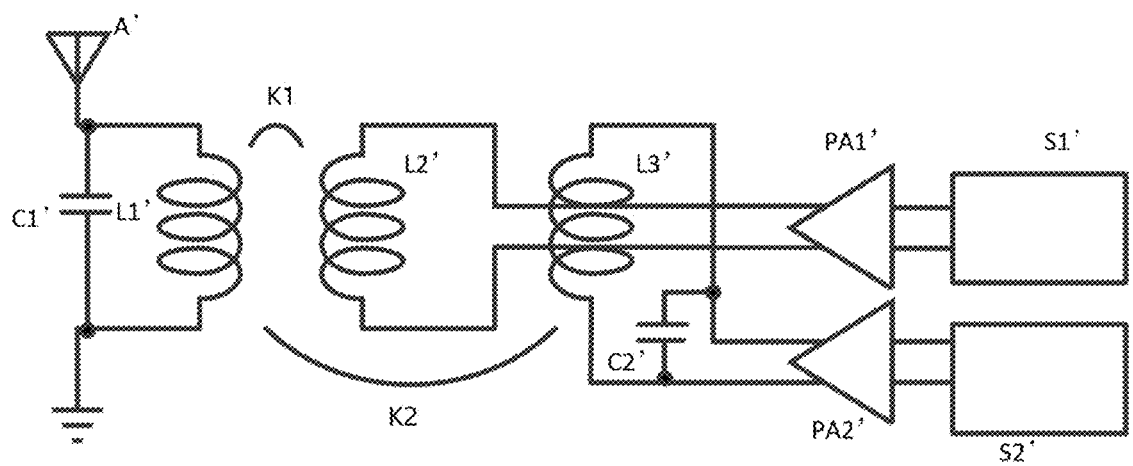
FIG. 4 is an equivalent circuit diagram of an electronic device according to embodiments of the present disclosure.

Referring to FIGS. 3 and 4, in an exemplary application, the first inductor L1' may be configured to be connected to a load (such as, an antenna A' or other types of loads). The second inductor L2' may be configured to be connected to the first power amplifier circuit PA1'. The third inductor L3' may be configured to be connected to the second power amplifier circuit PA2'. The first power amplifier circuit PA1' and the second power amplifier circuit PA2' may have different requirements on respective output powers.

When seen from the first pair of input terminals IT1', the equivalent load as acquired is affected by the first coupling coefficient between the second inductor L2' and the first inductor L1' as well as their respective inductance values. When seen from the second pair of input terminals IT2', the equivalent load as acquired is affected by the second coupling coefficient between the third inductor L3' and the first inductor L1' as well as their respective inductance values. The aforesaid two coupling coefficients can be designed independently, which lowers the requirements on the respective inductance values of the second inductor L2' and the third inductor L3' and enables the overall area occupied by all the inductor coils to be reduced. In addition, this solution can meet differentiated requirements on impedances.

Furthermore, due to the addition of the respective design parameters of the aforesaid two coupling coefficients, the matching network can be designed in a more flexible manner.

Furthermore, since the second inductor L2' and the third inductor L3' are not connected to each other, the mutual interference between signal sources connected to them respectively can be reduced, and the circuit structure can be simpler, which makes it easy to perform design and simulate-verification.

Figure 5:
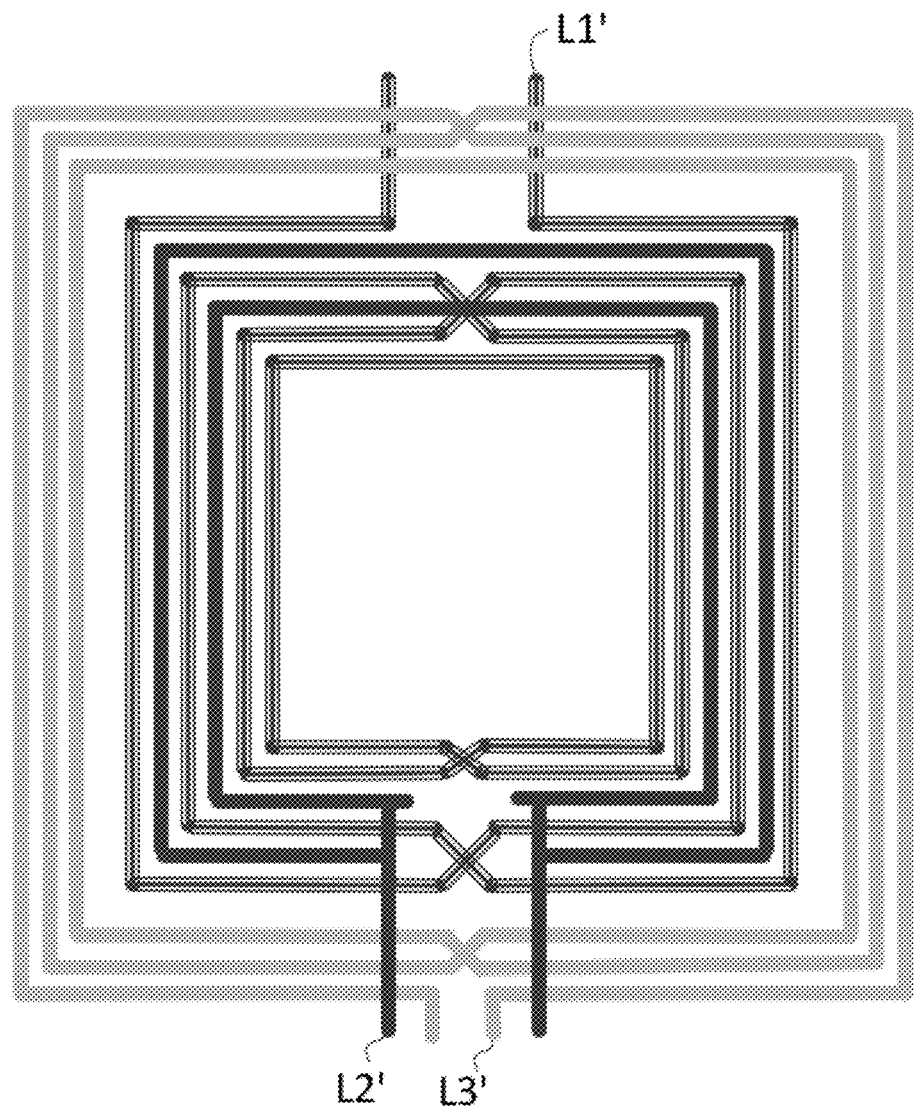
FIG. 5 is an exemplary layout of the matching network as shown in FIG. 2.

In some embodiments, referring to FIG. 5, the first inductor L1', the second inductor L2' and the third inductor L3' may be arranged on a same substrate. The first inductor L1' has a winding portion with a first orthographic projection onto a plane where the substrate is disposed, the second inductor L2' has a winding portion with a second orthographic projection onto the plane, and the third inductor L3' has a winding portion with a third orthographic projection onto the plane. There is a first overlapping area between the first orthographic projection and the second orthographic projection, and there is a second overlapping area between the first orthographic projection and the third orthographic projection, where the first overlapping area may be greater than the second overlapping area.

The different types of lines in FIG. 5 represent different wiring layers. The first inductor L1', the second inductor L2', and the third inductor L3' may be provided on a same layer, and the crossing portions may be connected by vias and jumpers.

The smaller the overlapping area between the first orthographic projection and the second orthographic projection, the lower the first coupling coefficient therebetween. In this case, the resistance value of the equivalent load impedance seen from two ends of the third inductor L3' can also be rather large without the necessity to configure the third inductor L3' to have a particularly large inductance value.

The present disclosure does not limit the material of the substrate, such as a semiconductor substrate or a glass substrate.

In some embodiments, referring to FIG. 5, the third orthographic projection may surround the first orthographic projection and the second orthographic projection without overlapping with either the first orthographic projection or the second orthographic projection.

In this case, the second coupling coefficient between the third inductor L3' and the first inductor L1' may be configured small enough to further lower the inductance value of the third inductor L3'.

In some embodiments, the third inductor L3' may have a greater inductance value than the second inductor L2'.

In this case, the resistance value of equivalent load impedance as seen from two ends of the third inductor L3' is greater than that as seen from two ends of the second inductor L2'.

In some embodiments, the matching network may further include a first capacitor C1' connected across the first inductor L1'.

The first capacitor C1' may function to adjust the resonance frequency.

In some embodiments, the matching network may further include a second capacitor C2' connected across the third inductor L3'.

Since the second coupling coefficient between the third inductor L3' and the first inductor L1' is relatively small, in some embodiments, the function of the first capacitor C1' in the equivalent circuit formed by the load and the matching network may be relatively attenuated, and thus the second capacitor C2' may be required to be added for compensation.

In some embodiments, the first coupling coefficient between the first inductor L1' and the second inductor L2' may be greater than 0.7, and the second coupling coefficient between the first inductor L1' and the third inductor L3' may be less than 0.5.

In this case, the difference between the two coupling coefficients is large enough to adapt to the greater difference between respective impedances that is required for different power amplifier circuits.

Referring to FIG. 3, embodiments of the present disclosure further provide an antenna circuit, which includes an antenna A' and the aforesaid matching network. The first inductor L1' has one end grounded and the other end connected to the antenna A', where at a same frequency within an operating frequency band of the antenna A', the first pair of input terminals IT1' has a first equivalent load impedance with a first resistance value and the second pair of input terminals IT2' has a second equivalent load impedance with a second resistance value, the first resistance value being smaller than the second resistance value.

When seen from the first pair of input terminals IT1' and the second pair of input terminals IT2', the antenna A' presents different impedances respectively, which can meet different requirements on the transmission power.

Referring to FIG. 4, embodiments of the present disclosure further provide an electronic device, which includes a first power amplifier circuit PA1', a second power amplifier circuit PA2', a first signal source S1', a second signal source S2' and the aforesaid antenna circuit. The first power amplifier circuit PA1' is configured to amplify a power of signal from the first signal source S1' and provide the amplified signal to two ends of the second inductor L2' (that is, the first pair of input terminals ITV), and the second power amplifier circuit PA2' is configured to amplify a power of signal from the second signal source S2' and provide the amplified signal to two ends of the third inductor L3' (that is, the second pair of input terminals IT2').

In some embodiments, the first signal source S1' may be a Wi-Fi signal source, and the second signal source S2' may be a Bluetooth signal source.

The radiant power of the Wi-Fi signal is required to be much greater than the radiant power of the Bluetooth signal. For example, in some application scenarios, the resistive component of the equivalent load impedance of the first power amplifier circuit PA1' shall be about 5Ω, and the resistive component of the equivalent load impedance of the second power amplifier circuit PA2' shall be about 150Ω. Since the second coupling coefficient between the third inductor and the first inductor can be designed to have a relatively small value, the resistive component of the equivalent load impedance of the second power amplifier circuit PA2' can also be made large enough without the necessity to configure the third inductor to have a particularly large inductance value. In this way, the substrate area used to manufacture the inductors can be greatly saved.

The respective embodiments of the present disclosure are described in a progressive manner. The reference may be made to each other for the same or similar parts of the respective embodiments, and each embodiment focuses on the differences from other embodiments.

The protection scope of the present disclosure is not limited to the aforesaid embodiments, and obviously, one skilled in the art may make various modifications and variations to the present disclosure without departing from the scope of the present disclosure. If the modifications and variations of the present disclosure fall within the scope of the claims and their equivalents, the present disclosure is also intended to encompass such modifications and variations.

What is claimed is:

1. A matching network, comprising a first inductor (L1'), a second inductor (L2') and a third inductor (L3'), the first inductor (L1') having two ends serving as a pair of output terminals (OT'), the second inductor (L2') having two ends serving as a first pair of input terminals (IT1'), and the third inductor (L3') having two ends serving as a second pair of input terminals (IT2'), wherein a first coupling coefficient between the first inductor (L1') and the second inductor (L2') is greater than a second coupling coefficient between the first inductor (L1') and the third inductor (L3'), wherein the first inductor (L1'), the second inductor (L2') and the third inductor (L3') are arranged on a same substrate, so that the first inductor (L1') has a winding portion with a first orthographic projection onto a plane where the substrate is disposed, the second inductor (L2') has a winding portion with a second orthographic projection onto the plane, and the third inductor (L3') has a winding portion with a third orthographic projection onto the plane, with a first overlapping area between the first orthographic projection and the second orthographic projection being greater than a second overlapping area between the first orthographic projection and the third orthographic projection.

2. The matching network according to claim 1, wherein the third orthographic projection surrounds the first orthographic projection and the second orthographic projection without overlapping with either the first orthographic projection or the second orthographic projection.

3. The matching network according to claim 1, wherein the third inductor (L3') has a greater inductance value than the second inductor (L2').

4. The matching network according to claim 1, further comprising a first capacitor (C1') connected across the first inductor (L1').

5. The matching network according to claim 4, further comprising a second capacitor (C2') connected across the third inductor (L3').

6. The matching network according to claim 1, wherein the first coupling coefficient between the first inductor (L1') and the second inductor (L2') is greater than 0.7, and the second coupling coefficient between the first inductor (L1') and the third inductor (L3') is less than 0.5.

7. An antenna circuit, comprising an antenna (A') and a matching network according to claim 1, the first inductor (L1') having one end grounded and the other end connected to the antenna (A'), wherein at a same frequency within an operating frequency band of the antenna (A'), the first pair of input terminals (IT1') has a first equivalent load impedance with a first resistance value and the second pair of input terminals (IT2') has a second equivalent load impedance with a second resistance value, the first resistance value being smaller than the second resistance value.

8. An electronic device, comprising a first power amplifier circuit (PA1'), a second power amplifier circuit (PA2'), a first signal source (S1'), a second signal source (S2') and an antenna circuit according to claim 7, wherein the first power amplifier circuit (PA1') is configured to amplify a power of signal from the first signal source (S1') to be provided to the first pair of input terminals (IT1'), and the second power amplifier circuit (PA2') is configured to amplify a power of signal from the second signal source (S2') to be provided to the second pair of input terminals (IT2').

9. The electronic device according to claim 8, wherein the first signal source (S1') is a Wi-Fi signal source, and the second signal source (S2') is a Bluetooth signal source.

\* \* \* \* \*